(12) United States Patent
Park et al.

(10) Patent No.: US 11,749,557 B2
(45) Date of Patent: Sep. 5, 2023

(54) WAFER PROCESSING APPARATUS

(71) Applicant: ZEUS CO., LTD., Hwaseong-si (KR)

(72) Inventors: Jiho Park, Hwaseong-si (KR); Woon Kong, Cheonan-si (KR)

(73) Assignee: ZEUS CO., LTD., Hwaseong-si (KR)

( * ) Notice: Subject to any disclaimer, the term of this patent is extended or adjusted under 35 U.S.C. 154(b) by 247 days.

(21) Appl. No.: 17/354,225

(22) Filed: Jun. 22, 2021

(65) Prior Publication Data

US 2021/0398842 A1 Dec. 23, 2021

(30) Foreign Application Priority Data

Jun. 22, 2020 (KR) ........................ 10-2020-0075521

(51) Int. Cl.
| | |
|---|---|
| *H01L 21/687* | (2006.01) |
| *F26B 5/08* | (2006.01) |
| *B08B 13/00* | (2006.01) |
| *B05B 13/02* | (2006.01) |
| *B05B 13/04* | (2006.01) |
| *H01L 21/67* | (2006.01) |

(Continued)

(52) U.S. Cl.
CPC ........ *H01L 21/68785* (2013.01); *B05B 13/02* (2013.01); *B05B 13/0278* (2013.01); *B05B 13/0426* (2013.01); *B08B 3/022* (2013.01); *B08B 3/08* (2013.01); *B08B 13/00* (2013.01); *F26B 5/08* (2013.01); *H01L 21/67034* (2013.01); *H01L 21/67051* (2013.01); *H01L 21/67063* (2013.01); *H01L 21/68792* (2013.01); *B08B 2203/0211* (2013.01)

(58) Field of Classification Search
None
See application file for complete search history.

(56) References Cited

U.S. PATENT DOCUMENTS

| 8,267,103 | B2* | 9/2012 | Park ......................... B08B 3/02 134/902 |
| 2002/0136829 | A1* | 9/2002 | Kitano .................. B05C 5/0216 427/282 |

(Continued)

FOREIGN PATENT DOCUMENTS

| KR | 10-2017-0108158 | 9/2017 |
| TW | 200939383 | 9/2009 |

(Continued)

*Primary Examiner* — Spencer E. Bell
*Assistant Examiner* — Omair Chaudhri
(74) *Attorney, Agent, or Firm* — KILE PARK REED & HOUTTEMAN PLLC

(57) ABSTRACT

A wafer processing apparatus includes a rotating chuck which is rotatably installed inside a cup housing and on which a substrate is mounted, a nozzle table rotatably installed inside the rotating chuck, a guide installed inside the nozzle table, a moving module movably installed on the guide, a guide arm configured to support a fluid supply line part, a lower nozzle part coupled to the guide arm to move together with the moving module and connected to the fluid supply line part, a driving shaft part connected to the rotating chuck and the nozzle table to rotate the rotating chuck and the nozzle table, a moving shaft rotatably installed inside the driving shaft part and connected to the moving module to move the moving module, and a driver connected to the driving shaft part and the moving shaft.

14 Claims, 8 Drawing Sheets

(51) Int. Cl.
*B08B 3/02* (2006.01)
*B08B 3/08* (2006.01)

(56) References Cited

U.S. PATENT DOCUMENTS

| | | | | |
|---|---|---|---|---|
| 2007/0089767 A1* | 4/2007 | Yamamoto | ............... | B08B 3/02 |
| | | | | 134/137 |
| 2008/0314870 A1* | 12/2008 | Inoue | ..................... | B08B 1/04 |
| | | | | 118/58 |
| 2012/0186744 A1* | 7/2012 | Higashijima | ..... | H01L 21/68792 |
| | | | | 156/345.21 |
| 2015/0243495 A1* | 8/2015 | Chang | ............... | H01L 21/02087 |
| | | | | 134/6 |
| 2017/0221696 A1* | 8/2017 | Nishiyama | ........ | H01L 21/68742 |
| 2017/0294324 A1 | 10/2017 | Breingan et al. | | |
| 2018/0138059 A1* | 5/2018 | Cho | ................. | H01L 21/30604 |
| 2018/0221925 A1* | 8/2018 | Ito | ............................ | B08B 3/02 |
| 2020/0043756 A1* | 2/2020 | Rangarajan | ....... | H01L 21/68728 |
| 2020/0402836 A1* | 12/2020 | Park | ................ | H01L 21/68792 |
| 2021/0086236 A1* | 3/2021 | Nakazawa | ........ | H01L 21/68742 |
| 2022/0075280 A1* | 3/2022 | Eum | ...................... | B08B 13/00 |
| 2023/0001456 A1* | 1/2023 | Shinohara | ......... | H01L 21/68764 |

FOREIGN PATENT DOCUMENTS

| | | |
|---|---|---|
| TW | 201405667 | 2/2014 |
| TW | 201709369 | 3/2017 |
| TW | 201915415 | 4/2019 |

\* cited by examiner

WAFER PROCESSING APPARATUS

CROSS-REFERENCE TO RELATED APPLICATION

This application claims priority to and the benefit of Korean Patent Application No. 10-2020-0075521, filed on Jun. 22, 2020, the disclosure of which is incorporated herein by reference in its entirety.

BACKGROUND

1. Field of the Invention

The present invention relates to a wafer processing apparatus, and more particularly, to a wafer processing apparatus capable of simultaneously processing both side surfaces of a wafer and preventing a chemical liquid from remaining inside a nozzle table.

2. Discussion of Related Art

Generally, in semiconductor devices, a predetermined thin film is formed on a silicon wafer used as a semiconductor wafer. As the silicon wafer undergoes unit processes such as a chemical vapor deposition process, a sputtering process, a photolithography process, an etching process, an ion implantation process, a chemical mechanical polishing process, and the like, a thin film pattern is formed on the silicon wafer.

In order to manufacture a semiconductor device, a plurality of thin films are formed on the semiconductor wafer. An etching process is generally employed so as to form the plurality of thin films. Since foreign materials are attached to a backside of the semiconductor wafer in the etching process, a cleaning process and a drying process are performed to remove the foreign materials from the semiconductor wafer.

However, according to the related art, when a treatment liquid of the semiconductor device remains in a lower nozzle part and a nozzle driving module, fumes may be generated due to volatility of the treatment liquid in the cleaning process or a rebound of a residual material may be generated in the drying process. Thus, cleaning dispersion or wafer defects may occur. Therefore, there is a need to solve such a problem.

The background art of the present invention is disclosed in Korean Patent Laid-Open Application No. 2017-0108158 (published on Sep. 26, 2017, entitled "Wafer Processing System with Chuck Assembly Maintenance Module").

SUMMARY OF THE INVENTION

The present invention is directed to a wafer processing apparatus capable of simultaneously processing both side surfaces of a wafer and preventing a chemical liquid from remaining inside a nozzle table.

According to an aspect of the present invention, there is provided a wafer processing apparatus including a rotating chuck which is rotatably installed inside a cup housing and on which a wafer is mounted, a nozzle table rotatably installed inside the rotating chuck, a guide installed inside the nozzle table, a moving module movably installed on the guide, a guide arm connected to the moving module and configured to support a fluid supply line part, a lower nozzle part coupled to the guide arm to move together with the moving module and connected to the fluid supply line part, a driving shaft part connected to the rotating chuck and the nozzle table to rotate the rotating chuck and the nozzle table, a moving shaft rotatably installed inside the driving shaft part and connected to the moving module to move the moving module, and a driver connected to the driving shaft part and the moving shaft to drive the driving shaft part and the moving shaft.

The guide may include a guide rail disposed to cross the inside of the nozzle table. The moving module may include a slider movably coupled to the guide rail, and a rack bar connected to the slider, connected to the guide arm, and installed to be engaged with the moving shaft.

The moving shaft may include a moving shaft body rotatably installed in a central portion of the driving shaft part and connected to the driver, and a pinion connected to the moving shaft body to be engaged with the rack bar.

The lower nozzle part may include a first lower nozzle installed on the guide arm to be moved together with the rack bar and connected to the fluid supply line part, and a second lower nozzle installed on the guide arm to be moved together with the rack bar and connected to the fluid supply line part.

The driving shaft part may include a first driving shaft connected to the rotating chuck and the driver, and a second driving shaft rotatably installed between the first driving shaft and the moving shaft and connected to the nozzle table and the driver.

The second driving shaft may include a second outer shaft disposed inside the first driving shaft to be concentric therewith, and a second inner shaft which is disposed inside the second outer shaft to be concentric therewith and in which a fluid flow line part connected to the fluid supply line part is formed.

The driver may include a first driver connected to the first driving shaft and configured to rotate the first driving shaft, a second driver connected to the second outer shaft and configured to rotate the second outer shaft, and a third driver connected to the moving shaft and configured to rotate the moving shaft.

During a chemical liquid process, the first driver may be controlled to rotate the first driving shaft, the second driver may be controlled to stop the second outer shaft, and the third driver may be controlled to rotate the moving shaft.

During a cleaning process, the first driver may be controlled to rotate the first driving shaft, the second driver may be controlled to rotate the second outer shaft, and the third driver may be controlled to stop the moving shaft.

During a drying process, the first driver may be controlled to rotate the first driving shaft, the second driver may be controlled to rotate the second outer shaft, and the third driver may be controlled to stop the moving shaft.

The wafer processing apparatus may further include a cover member which is installed to cover an upper side of the nozzle table and in which a movement passage is formed to allow the lower nozzle part to be moved.

The cover member may be formed in the form of a circular plate to cover the upper side of the nozzle table.

The movement passage may be formed along the guide to allow the lower nozzle part to move.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

Figure 1:
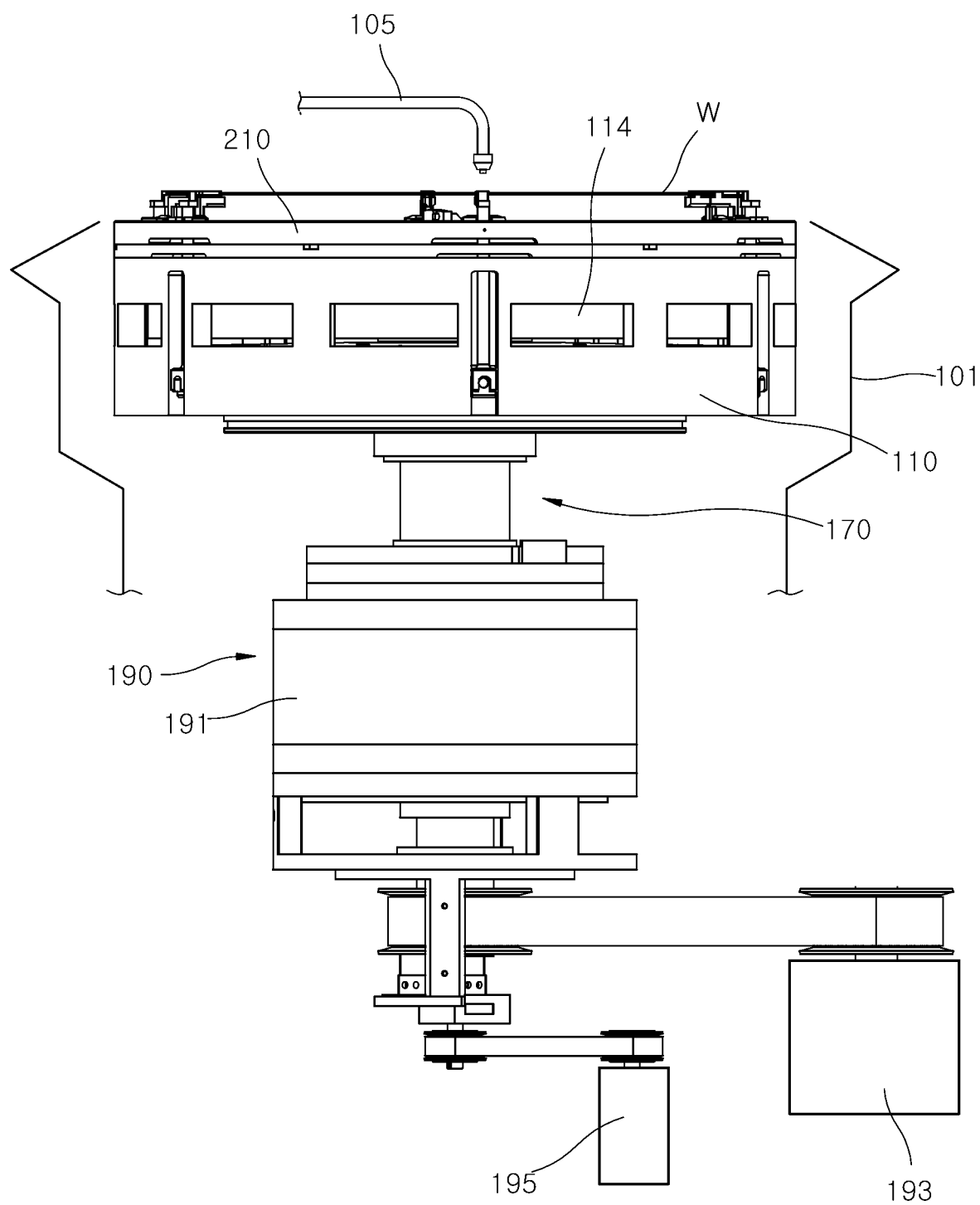
FIG. 1 is a side view illustrating a wafer processing apparatus according to one embodiment of the present invention.

Hereinafter, embodiments of a wafer processing apparatus according to the present invention will be described with reference to the accompanying drawings. In the following description of the wafer processing apparatus, thicknesses of lines and sizes of components shown in the drawings may be exaggerated for clarity and convenience of the description. In addition, the terms described below are defined in consideration of the functions in the present invention, and these terms may be varied according to the intent or custom of a user or an operator. Therefore, the definitions of the terms used herein should follow contexts disclosed herein.

Figure 2:
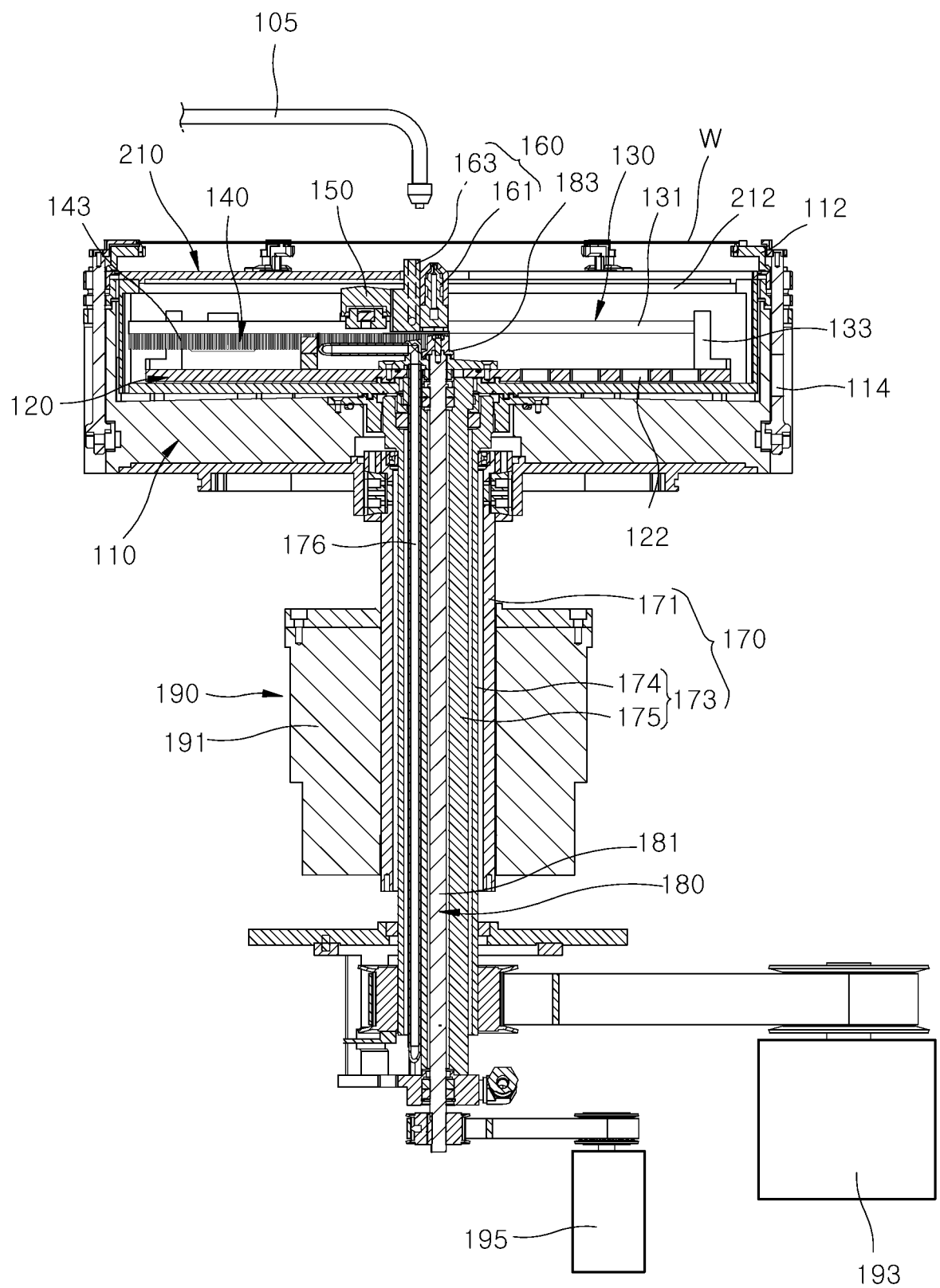
FIG. 2 is a cross-sectional view illustrating the wafer processing apparatus according to one embodiment of the present invention.
Figure 3:
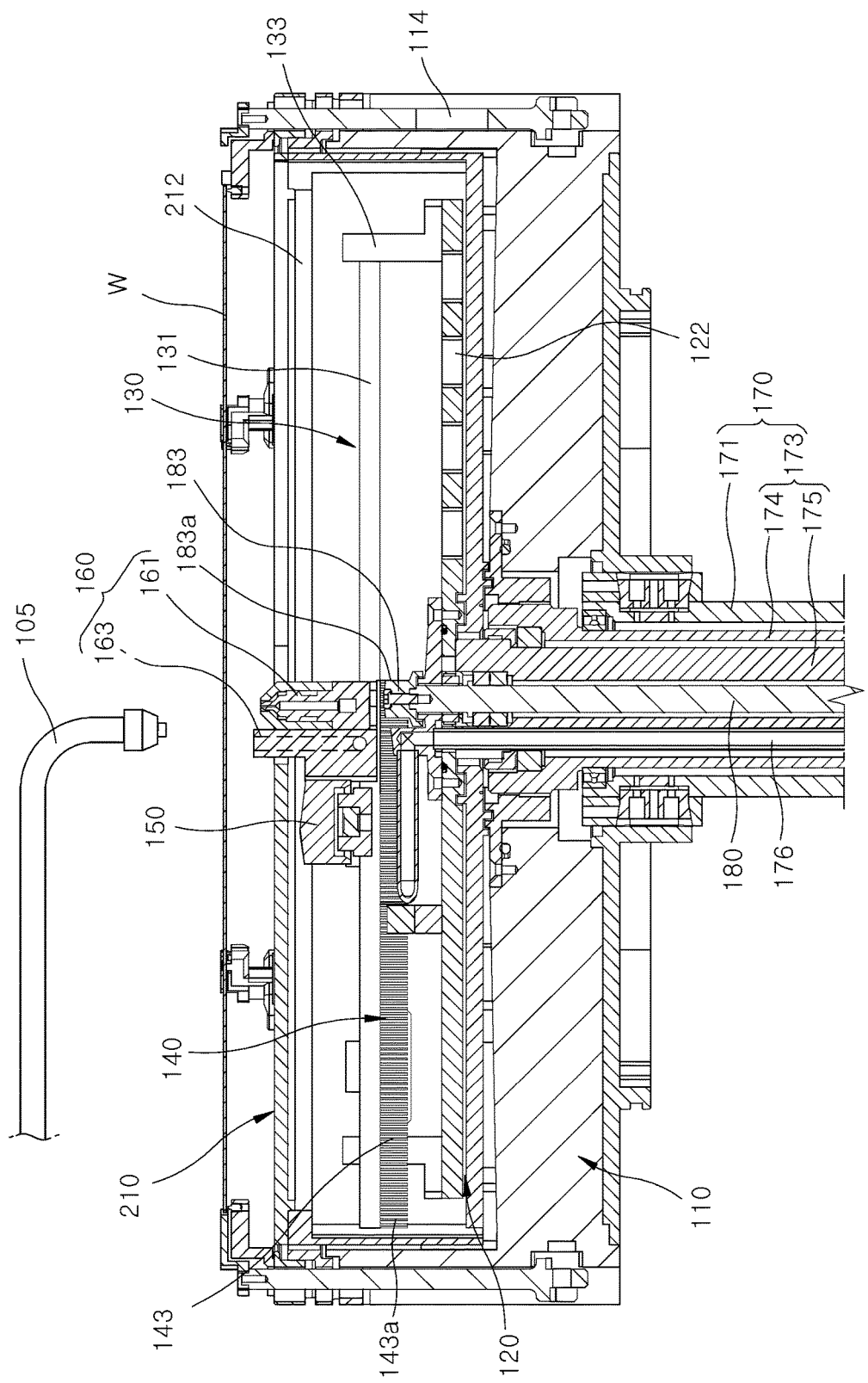
FIG. 3 is an enlarged view illustrating a rotating chuck and a nozzle table in the wafer processing apparatus according to one embodiment of the present invention.
Figure 4:
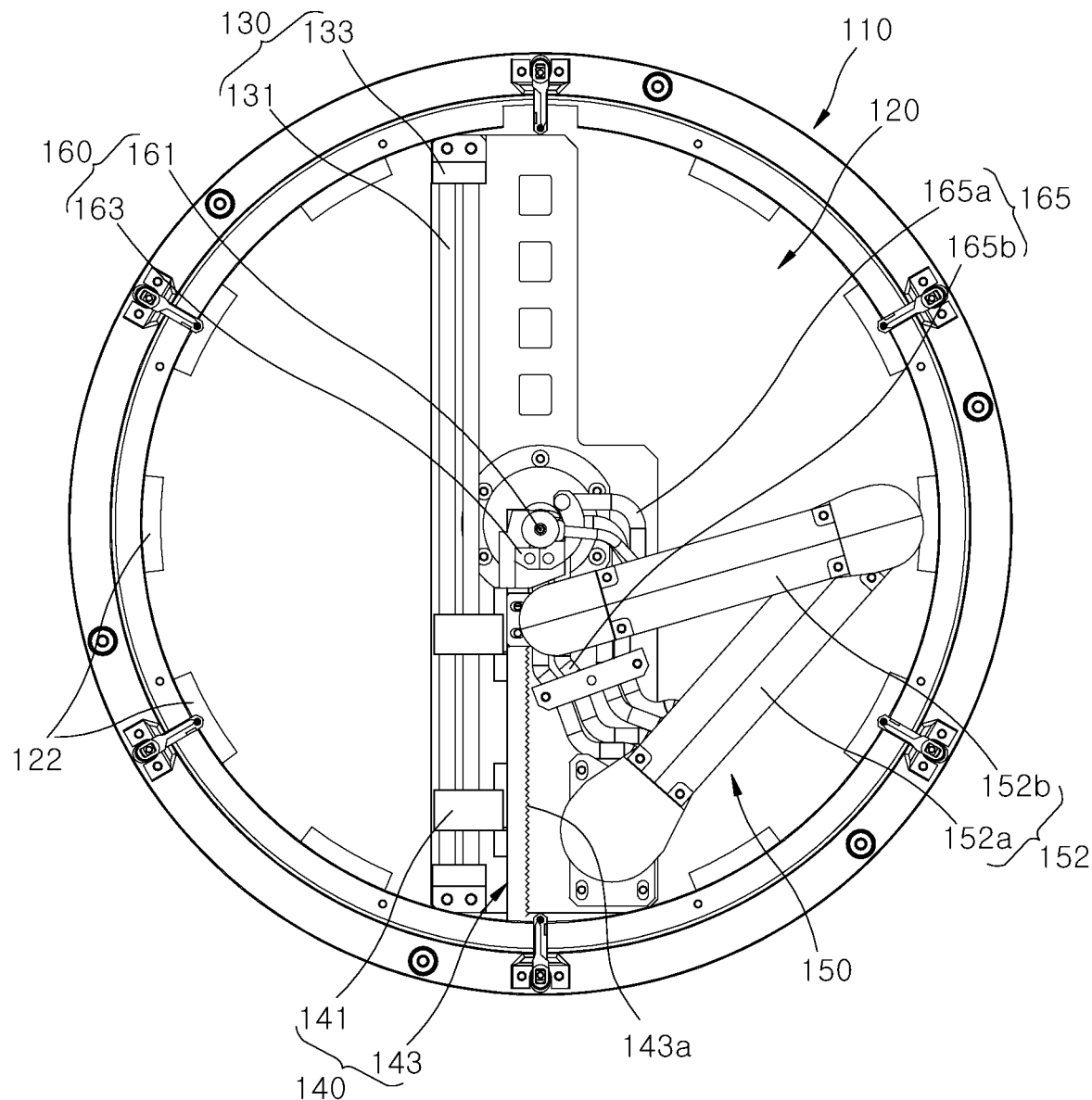
FIG. 4 is a plan view illustrating the wafer processing apparatus according to one embodiment of the present invention.
Figure 5:
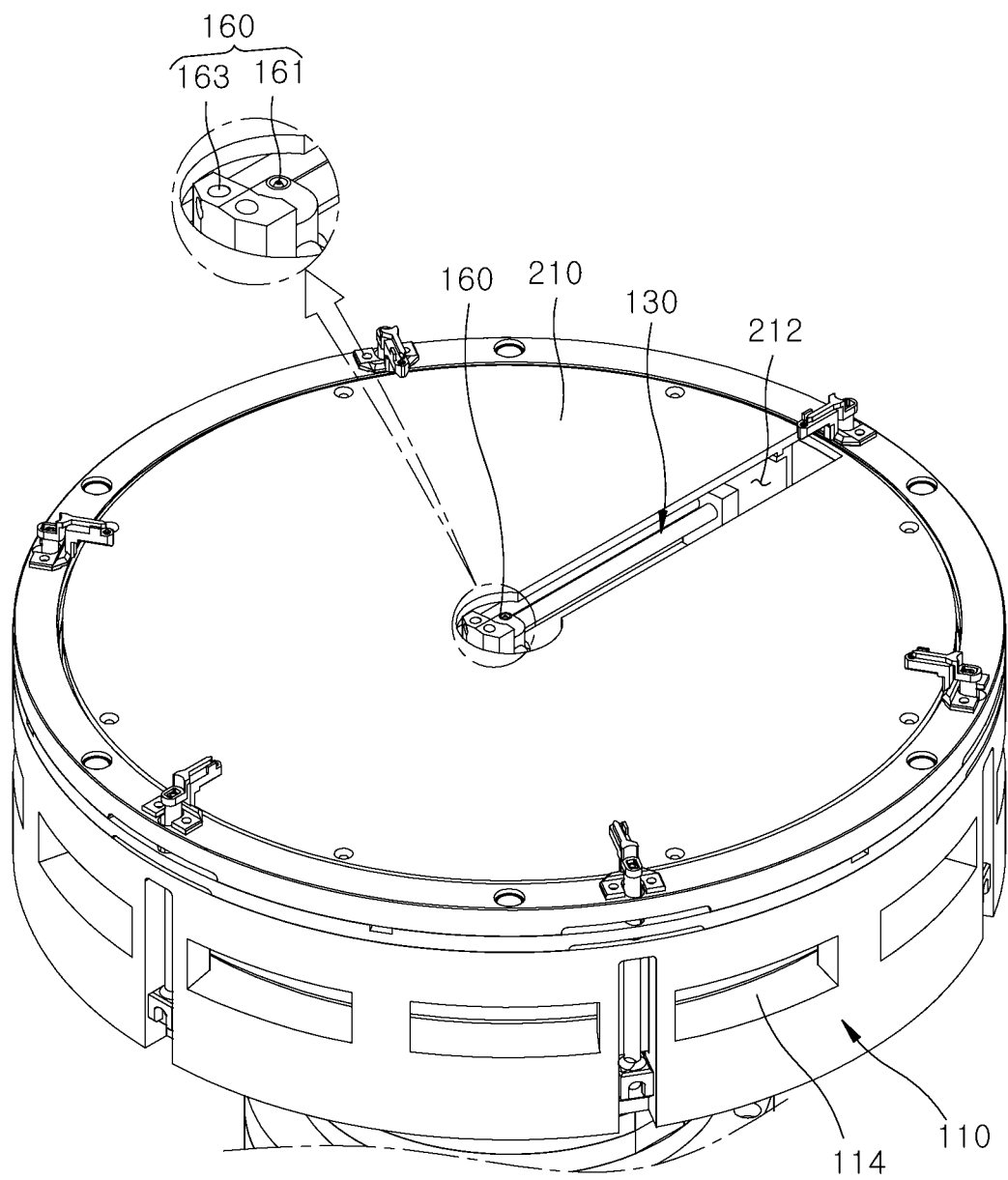
FIG. 5 is a perspective view illustrating the wafer processing apparatus according to one embodiment of the present invention.

FIG. 1 is a side view illustrating a wafer processing apparatus according to one embodiment of the present invention, FIG. 2 is a cross-sectional view illustrating the wafer processing apparatus according to one embodiment of the present invention, FIG. 3 is an enlarged view illustrating a rotating chuck and a nozzle table in the wafer processing apparatus according to one embodiment of the present invention, FIG. 4 is a plan view illustrating the wafer processing apparatus according to one embodiment of the present invention, and FIG. 5 is a perspective view illustrating the wafer processing apparatus according to one embodiment of the present invention.

Referring to FIGS. 1 to 5, a wafer processing apparatus 100 according to one embodiment of the present invention includes a rotating chuck 110, a nozzle table 120, a guide 130, a moving module 140, a guide arm 150, a lower nozzle part 160, and a driving shaft part 170, a moving shaft 180, and a driver 190.

A cup housing 101 is formed in the form of a container with an open upper side. An upper nozzle 105 is installed above the cup housing 101 to spray a chemical liquid or a cleaning solution to a substrate W mounted on the rotating chuck 110. The upper nozzle 105 is rotated or moved by a moving device (not shown).

The rotating chuck 110 is rotatably installed in the cup housing 101, and the substrate W is mounted on the rotating chuck 110. The rotating chuck 110 is formed in the form of a cylinder of which an upper side is open and a lower side and a periphery are closed. A plurality of jig pins 112 are installed on a periphery of the upper side of the rotating chuck 110 to support a periphery of the substrate W. The plurality of jig pins 112 may be disposed at equal intervals. The jig pins 112 may correct a position of the substrate W to allow a center of the substrate W to coincide with a rotation center of the rotating chuck 110.

A plurality of discharge holes 114 are formed in the periphery of the rotating chuck 110 so as to discharge a fluid. Accordingly, when the rotating chuck 110 is rotated, fluids (a chemical liquid and a cleaning solution) may be easily discharged due to a centrifugal force of the rotating chuck 110.

The nozzle table 120 is rotatably installed in the rotating chuck 110. The nozzle table 120 is formed in a cylindrical shape of which an upper side is open and a lower side and a side surface are closed. A plurality of table holes 122 are formed on a bottom surface of the nozzle table 120 so as to allow the chemical liquid and the cleaning solution, which are introduced into the nozzle table 120, to be discharged. The plurality of table holes 122 are disposed along the periphery of the nozzle table 120.

The guide 130 is installed inside the nozzle table 120. The moving module 140, a fluid supply line part 165, the lower nozzle part 160, and a guide arm 150 are installed inside the nozzle table 120. In this case, the guide 130 includes a guide rail 131 disposed to cross the inside of the nozzle table 120. The guide rail 131 is disposed to be biased to one side from a rotation center of the nozzle table 120 and is disposed parallel to a diameter of the nozzle table 120. A pair of guide rails 131 are disposed to be parallel to a plane which is parallel to the bottom surface of the nozzle table 120. Both sides of the guide rail 131 are disposed on the periphery of the nozzle table 120 by a guide block 133.

The moving module 140 is movably installed on the guide 130. The moving module 140 is moved parallel to the diameter of the nozzle table 120 by the guide rail 131. A movement range of the moving module 140 is set to be slightly smaller than a radius of the nozzle table 120. Various shapes of moving modules may be applied to the moving module 140 as long as they can be moved along the guide 130. In the following description, one example of the moving module 140 will be described.

The moving module 140 includes a slider 141 and a rack bar 143. The slider 141 is movably coupled to the guide rail 131. The slider 141 is formed in a block shape and installed as a plurality of sliders. The rack bar 143 is connected to the slider 141, the lower nozzle part 160 is disposed on the rack bar 143, and the rack bar 143 is installed to be engaged with the moving shaft 180. A rack gear 143a is installed on the rack bar 143 in a lengthwise direction of the rack bar 143. Since the slider 141 is movably coupled to the pair of guide rails 131, when the rack bar 143 is moved, it is possible to prevent the rack bar 143 from shaking.

The guide arm 150 is connected to the moving module 140 and is installed to support the fluid supply line part 165. The fluid supply line part 165 includes a chemical liquid supply line 165a which is disposed inside the guide arm 150 and through which a chemical liquid flows, and a cleaning solution supply line 165b which is disposed parallel to the chemical liquid supply line 165a and through which a cleaning solution flows. Since the guide arm 150 supports the fluid supply line part 165, it is possible to prevent the fluid supply line part 165 from being damaged due to centrifugal forces of the rotating chuck 110 and the nozzle table 120.

The guide arm 150 includes a plurality of guide links 152 connected in a joint structure.

For example, the guide arm 150 includes a first guide link 152*a* rotatably installed on the nozzle table 120, and a second guide link 152*b* which is link-coupled to the first guide link 152*a* and is rotatably connected to the rack bar 143 and on which the lower nozzle part 160 is installed. The guide arm 150 may be formed of three or more guide links 152 according to the diameter of the nozzle table 120. When the rack bar 143 is moved, the first guide link 152*a* and the second guide link 152*b* are rotated in an unfolding or folding direction. As the second guide link 152*b* is rotated, the lower nozzle part 160 is moved along the guide 130.

The lower nozzle part 160 is coupled to the guide arm 150 to be moved together with the moving module 140 and is connected to the fluid supply line part 165. The lower nozzle part 160 includes a first lower nozzle 161 and a second lower nozzle 163. The first lower nozzle 161 is installed on the guide arm 150 to be moved together with the rack bar 143 and is connected to the chemical liquid supply line 165*a* of the fluid supply line part 165. One first spray hole (not shown) is formed in the first lower nozzle 161 to spray a chemical liquid. The second lower nozzle 163 is installed on the guide arm 150 to be moved together with the rack bar 143 and is connected to the cleaning solution supply line 165*b* of the fluid supply line part 165. A plurality of second spray holes (not shown) are formed in the second lower nozzle 163 to spray a cleaning solution. The first lower nozzle 161 is disposed to be concentric with the rotation center of the nozzle table 120, and the second lower nozzle 163 is disposed to be eccentric to the rotation center of the nozzle table 120.

The driving shaft part 170 is connected to the rotating chuck 110 and the nozzle table 120 to rotate the rotating chuck 110 and the nozzle table 120. The driving shaft part 170 includes a first driving shaft 171 and a second driving shaft 173.

The first driving shaft 171 is connected to the rotating chuck 110 and the driver 190. The first driving shaft 171 is vertically disposed in a vertical direction. The first driving shaft 171 is formed in the form of a circular pipe.

The second driving shaft 173 is rotatably installed between the first driving shaft 171 and the moving shaft 180 and is connected to the nozzle table 120 and the driver 190. The second driving shaft 173 is disposed to be concentric with the first driving shaft 171 and the moving shaft 180. The second driving shaft 173 is formed in the form of a circular pipe. The first driving shaft 171, the second driving shaft 173, and the moving shaft 180 are individually rotated by the driver 190.

The second driving shaft 173 includes a second outer shaft 174 and a second inner shaft 175. The second outer shaft 174 is disposed inside the first driving shaft 171 to be concentric with the first driving shaft 171. The second inner shaft 175 is disposed inside the second outer shaft 174 to be concentric therewith, and a fluid flow line part 176 connected to the fluid supply line part 165 is formed on the second inner shaft 175. The second outer shaft 174 and the second inner shaft 175 are formed in the form of a pipe to be concentric with each other. The fluid flow line part 176 is formed in a lengthwise direction of the second inner shaft 175 and includes a chemical liquid flow line (not shown) through which a chemical liquid flows and a chemical liquid flow line (not shown) which is disposed parallel to the chemical liquid flow line and through which a cleaning solution flows. The chemical liquid flow line is connected to the chemical liquid supply line 165*a*, and the cleaning solution flow line is connected to the cleaning solution supply line 165*b*. The fluid flow line part 176 is connected to a fluid supply device (not shown). The fluid supply device includes a chemical liquid supply device (not shown) and a cleaning solution supply device (not shown). Since the fluid flow line part 176 is formed in the second inner shaft 175, even when the second inner shaft 175 is rotated, a fluid may be supplied to the fluid supply line part 176 through the fluid flow line part 176.

The moving shaft 180 is rotatably installed inside the driving shaft part 170 and is connected to the moving module 140 to move the moving module 140. The moving shaft 180 includes a moving shaft body 181 and a pinion 183. The moving shaft body 181 is rotatably installed in a central portion of the driving shaft part 170 and is connected to the driver 190. The pinion 183 is connected to the moving shaft body 181 to be engaged with the rack bar 143. The pinion 183 is installed in an upper end portion of the moving shaft body 181. A pinion gear 183*a* is formed on a periphery of the pinion 183 to be engaged with the rack gear 143*a*. As the moving shaft 180 is rotated, the pinion 183 is rotated, and as the pinion 183 is rotated, the rack bar 143 is moved along the guide 130.

The driver 190 is connected to the driving shaft part 170 and the moving shaft 180 to drive the driving shaft part 170 and the moving shaft 180.

The driver 190 includes a first driver 191, a second driver 193, and a third driver 195. The first driver 191 is connected to the first driving shaft 171 to rotate the first driving shaft 171. The second driver 193 is connected to the second outer shaft 174 to rotate the second outer shaft 174. The third driver 195 is connected to the moving shaft 180 to rotate the moving shaft 180.

A hollow motor in which the first driving shaft 171 is connected to a rotor (not shown) or a belt driven motor, which is connected to the first driving shaft 171 by a belt, may be applied as the first driver 191. A belt driven motor connected to the second outer shaft 174 or a clutch module for restraining and releasing the second outer shaft 174 and the first driving shaft 171 may be applied as the second driver 193. In addition, a belt driven motor connected to the moving shaft 180 or a directly connected motor with a rotating shaft connected to the moving shaft 180 may be applied as the third driver 195.

The first driver 191, the second driver 193, and the third driver 195 may individually rotate the first driving shaft 171, the second outer shaft 174, and the moving shaft 180 or may simultaneously rotate some of the first driving shaft 171, the second outer shaft 174, and the moving shaft 180.

For example, during a chemical liquid process, the first driver 191 is controlled to rotate the first driving shaft 171, the second driver 193 is controlled to stop the second outer shaft 174, and the third driver 195 is controlled to rotate the moving shaft 180. In this case, the upper nozzle 105 and the first lower nozzle 161 of the lower nozzle part 160 spray chemical liquids onto both side surfaces of the substrate W, and as the rotating chuck 110 is rotated, the substrate W is rotated. In addition, in a state in which the nozzle table 120 is stopped, the moving shaft 180 is rotated, and as the pinion 183 of the moving shaft 180 is rotated by being engaged with the rack gear 143*a* of the rack bar 143, the lower nozzle part 160 is moved along the guide 130. The first lower nozzle 161 of the lower nozzle part 160 sprays the chemical liquid onto a lower surface of the substrate W, and the second lower nozzle 163 is not driven. Thus, the chemical liquid flows toward peripheries of both side surfaces of the substrate W due to a centrifugal force of the substrate W to process the substrate W.

During a cleaning process, the first driver 191 is controlled to rotate the first driving shaft 171, the second driver 193 is controlled to rotate the second outer shaft 174, and the third driver 195 is controlled to stop the moving shaft 180. In this case, the upper nozzle 105 and the second lower nozzle 163 of the lower nozzle part 160 spray cleaning solutions onto the both side surfaces of the substrate W, and as the rotating chuck 110 is rotated, the substrate W is rotated. In addition, the rotating chuck 110 and the nozzle table 120 are simultaneously rotated, and the moving shaft 180 is maintained in a stationary state. Since the second lower nozzle 163 of the lower nozzle part 160 sprays the cleaning solution onto the lower surface of the substrate W, the cleaning solution flows toward peripheries of the both side surfaces of the substrate W due to the centrifugal force of the substrate W to clean the substrate W. In this case, the moving module 140, the guide arm 150 and the lower nozzle part 160 are maintained in a stationary state.

During a drying process, the first driver 191 is controlled to rotate the first driving shaft 171, the second driver 193 is controlled to rotate the second outer shaft 174, and the third driver 195 is controlled to stop the moving shaft 180. In this case, the upper nozzle 105 and the second lower nozzle 163 of the lower nozzle part 160 spray a drying gas (inert gas) onto the both side surfaces of the substrate W according to a type of the substrate W, and as the rotating chuck 110 is rotated, the substrate W is rotated. In addition, the rotating chuck 110 and the nozzle table 120 are simultaneously rotated, and the moving shaft 180 is maintained in a stationary state. Since the second lower nozzle 163 of the lower nozzle part 160 sprays the drying gas onto the lower surface of the substrate W, the drying gas flows toward the peripheries of the both side surfaces of the substrate W due to the centrifugal force of the substrate W to dry the substrate W. An inert gas such as nitrogen gas may be applied as the drying gas. In this case, the moving module 140, the guide arm 150, and the lower nozzle part 160 are maintained in a stationary state.

During the drying process, the drying gas may not be sprayed from the upper nozzle 105 and the second lower nozzle 163. In this case, since the cleaning solution remaining on the substrate W flows to the periphery of the substrate W due to the centrifugal force of the substrate W, the substrate W is dried.

The wafer processing apparatus 100 further includes a cover member 210 which is installed to cover an upper side of the nozzle table 120 and in which a movement passage 212 is formed to allow the lower nozzle part 160 to move. Since the movement passage 212 is formed in the cover member 210, the lower nozzle part 160 may spray the chemical liquid onto the lower surface of the substrate W while being moved along the guide 130.

The cover member 210 is formed in the form of a circular plate to cover the upper side of the nozzle table 120. In addition, the movement passage 212 is formed along the guide 130 to allow the lower nozzle part 160 to move. The movement passage 212 is vertically disposed above the lower nozzle part 160. A central portion of the cover member 210 may be formed to be slightly convex upward. Since the central portion of the cover member 210 is formed to be convex upward, the chemical liquid or the cleaning solution which falls on the cover member 210 may be easily discharged to the outside. Alternatively, the cover member 210 may be formed in the form of a flat plate.

Since the cover member 210 covers the upper side of the nozzle table 120, the chemical liquid sprayed onto the substrate W is blocked by the cover member 210 and is hardly introduced into the inside of the nozzle table 120. In addition, during the chemical liquid process, since the nozzle table 120 is maintained in a stationary state, a small amount of the chemical liquid falling onto the cover member 210 also hardly flows on the cover member 210. Accordingly, it is possible to prevent the chemical liquid falling on the cover member 210 from being introduced into the nozzle table 120 through the movement passage 212.

During the chemical liquid process, since the inflow of the chemical liquid into the inside of the nozzle table 120 may be mostly blocked, it is possible to prevent the chemical liquid from remaining in the moving module 140, the fluid supply line part 165, the lower nozzle part 160, and the guide arm 150 which are installed inside the nozzle table 120. Further, since the chemical liquid is prevented from being introduced into the nozzle table 120 in the chemical liquid process, it is possible to prevent fumes from being generated during the cleaning process or prevent the chemical liquid which remains during the drying process from rebounding. In addition, it is possible to significantly reduce a cleaning dispersion and a defect rate of the substrate W.

Even when a small amount of the chemical liquid infiltrates into the nozzle table 120 in the chemical liquid process, since the nozzle table 120 is rotated in the cleaning process, the residing chemical liquid and the residing cleaning solution are discharged to the outside of the nozzle table 120 due to the centrifugal force of the nozzle table 120. In addition, since the upper side of the nozzle table 120 is blocked by the cover member 210, even when a small amount of fumes is generated inside the nozzle table 120, the fumes are blocked by the cover member 210 and hardly move upward. Thus, since the fumes generated from the nozzle table 120 are discharged to the outside of the nozzle table 120 due to an airflow generated when the nozzle table 120 is rotated, it is possible to prevent the fumes from reaching the substrate W.

An operation of the wafer processing apparatus according to the above-described embodiment of the present invention will be described.

Figure 6:
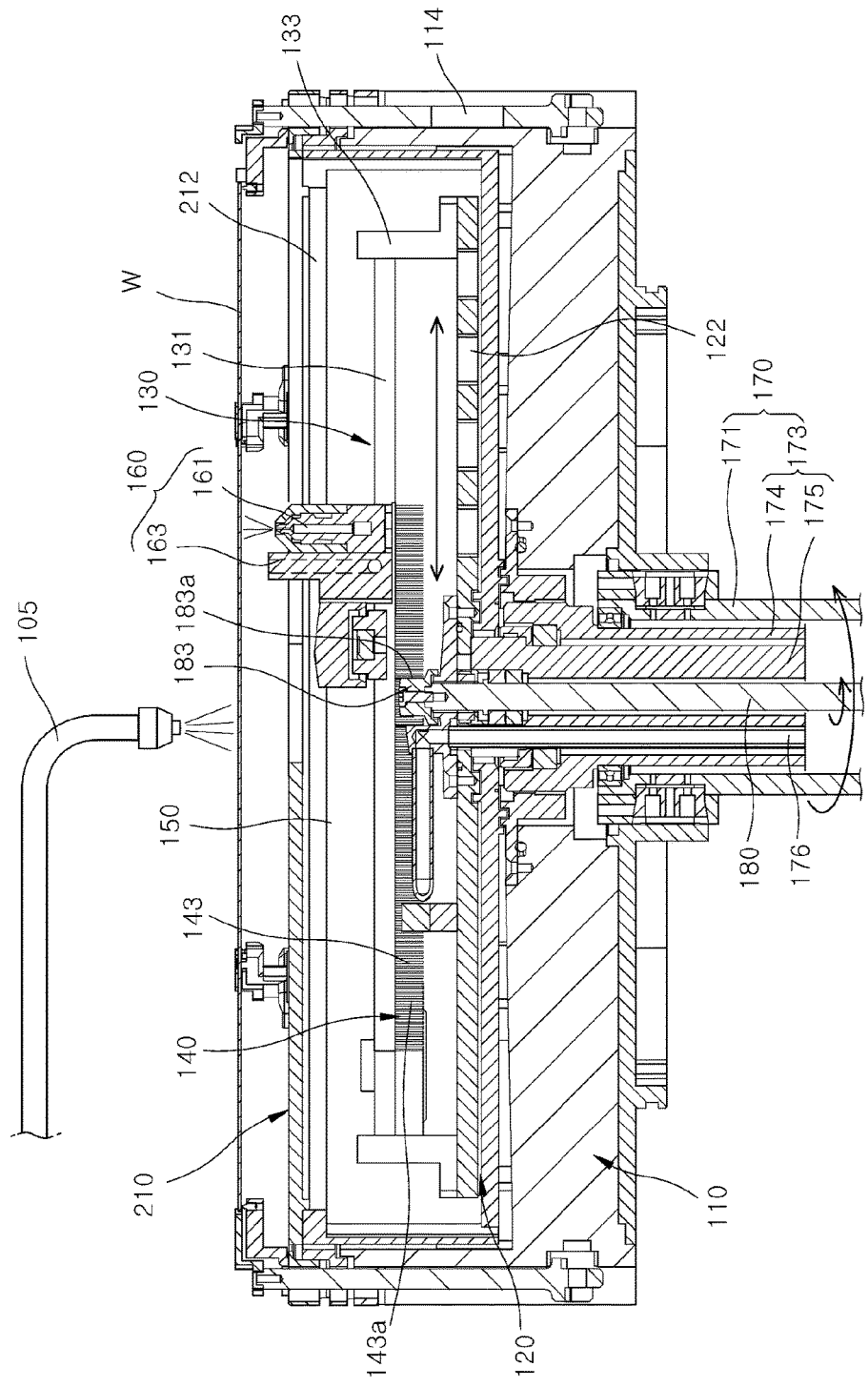
FIG. 6 is a cross-sectional view illustrating an operation state of the wafer processing apparatus during a chemical liquid process according to one embodiment of the present invention.

FIG. 6 is a cross-sectional view illustrating an operation state of the wafer processing apparatus during a chemical liquid process according to one embodiment of the present invention.

Referring to FIG. 6, the chemical liquid used in the chemical liquid process includes a lapping solution for smoothly treating a surface of the substrate W, an etching solution for etching the substrate W, and a polishing solution for polishing the surface of the substrate W.

When the chemical liquid process begins, the upper nozzle 105 and the first lower nozzle 161 spray the chemical liquid onto the both side surfaces of the substrate W. The chemical liquid is not sprayed from the second lower nozzle 163.

The first driver 191 rotates the first driving shaft 171, the second driver 193 stops the second outer shaft 174, and the third driver 195 rotates the moving shaft 180. As the rotating chuck 110 is rotated by the first driving shaft 171, the substrate W is rotated. The nozzle table 120 remains in a stationary state, and the moving shaft 180 is rotated by the third driver 195. As the pinion 183 of the moving shaft 180 is rotated by being engaged with the rack gear 143a of the rack bar 143, the first lower nozzle 161 reciprocates along the guide 130. Thus, the chemical liquid flows from the both side surfaces of the substrate W toward peripheries of the both side surfaces thereof due to a centrifugal force of the substrate W to treat the surface of the substrate W.

Since the cover member 210 covers the upper side of the nozzle table 120, excluding the movement passage 212, the chemical liquid sprayed onto the substrate W is blocked by the cover member 210 and is hardly introduced into the inside of the nozzle table 120. In this case, since the rotating chuck 110 is rotated, the chemical liquid sprayed from the first lower nozzle 161 is mainly discharged in a radial direction of the substrate W due to the centrifugal force of the substrate W. In addition, since the nozzle table 120 and the cover member 210 are maintained in a stationary state, it is also possible to prevent a small amount of the chemical liquid falling onto the cover member 210 from flowing on the cover member 210. Thus, it is possible to prevent the small amount of the chemical liquid falling on the cover member 210 from being introduced into the nozzle table 120 through the movement passage 212.

Consequently, during the chemical liquid process, since the inflow of the chemical liquid into the inside of the nozzle table 120 may be mostly blocked, it is possible to prevent the chemical liquid from remaining in the moving module 140, the fluid supply line part 165, the lower nozzle part 160, and the guide arm 150 which are installed inside the nozzle table 120.

Figure 7:
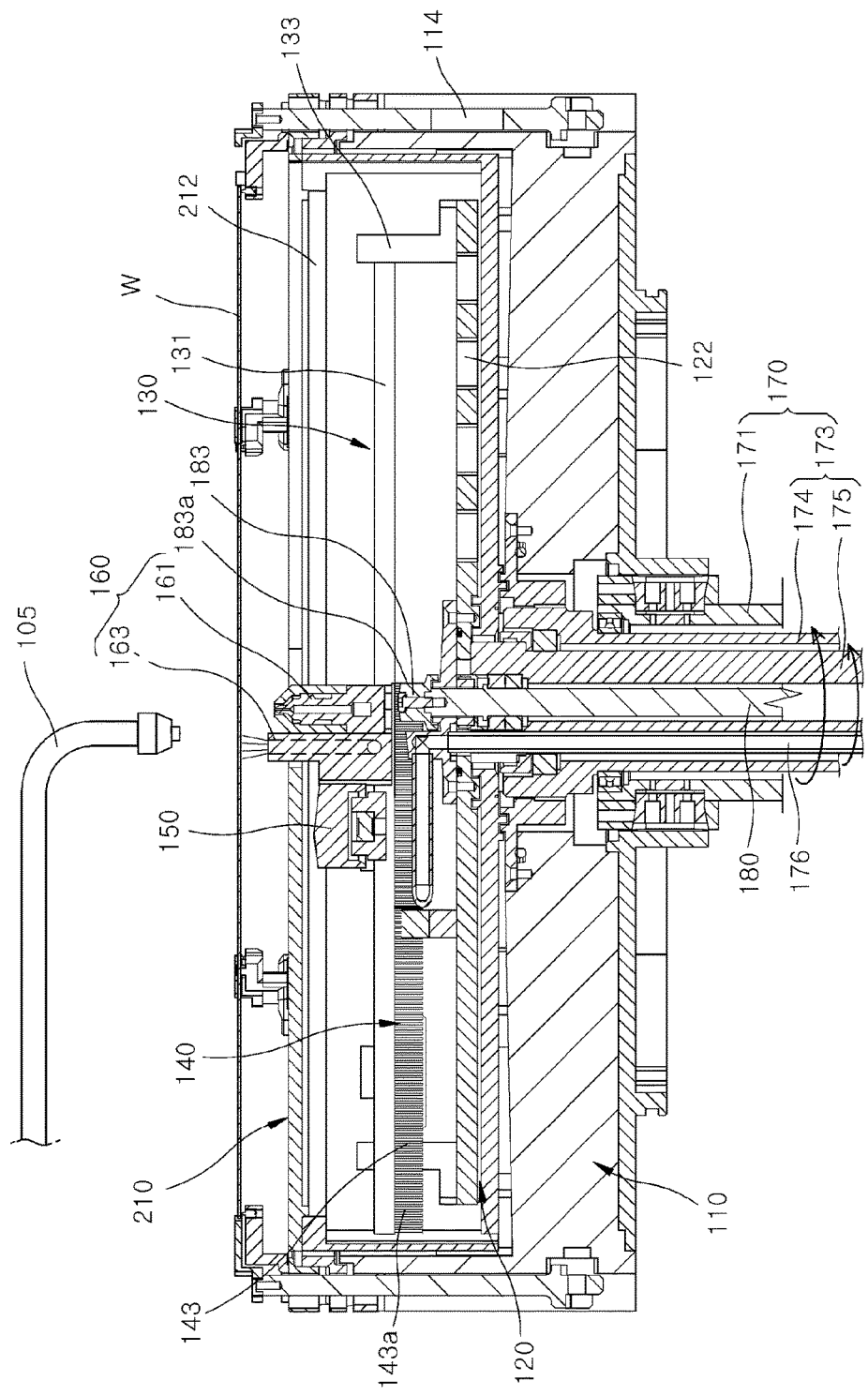
FIG. 7 is a cross-sectional view illustrating an operation state of the wafer processing apparatus during a cleaning process according to the embodiment of the present invention.

FIG. 7 is a cross-sectional view illustrating the operation state of the wafer processing apparatus during the cleaning process according to the embodiment of the present invention.

Referring to FIG. 7, when the cleaning process begins, the upper nozzle 105 and the second lower nozzle 163 spray the chemical liquid onto the both side surfaces of the substrate W. In addition, the first driver 191 is controlled to rotate the first driving shaft 171, the second driver 193 is controlled to rotate the second outer shaft 174, and the third driver 195 is controlled to stop the moving shaft 180. In this case, as the rotating chuck 110 is rotated by the first driving shaft 171, the substrate W is rotated, and as the second driving shaft 173 is rotated, the nozzle table 120 is simultaneously rotated together with the rotating chuck 110. Since the upper nozzle 105 and the second lower nozzle 163 spray the cleaning solution onto the both side surfaces of the substrate W, the cleaning solution flows from the both side surfaces of the substrate W toward the peripheries of the both side surfaces of the substrate W due to the centrifugal force of the substrate W to clean the substrate W.

In this case, since the cleaning solution on the lower surface of the substrate W is mainly discharged toward the periphery of the substrate W due to the centrifugal force of the substrate W, a small amount of the cleaning solution may fall on the cover member 210. The small amount of the cleaning solution falling on the cover member 210 is mainly discharged toward a periphery of the cover member 210 due to a centrifugal force of the cover member 210, and only a very small amount of the cleaning solution falling on the cover member 210 is introduced into the nozzle table 120 through the movement passage 212. The very small amount of the cleaning solution, which is introduced into the nozzle table 120, together with the remaining chemical liquid is discharged to the outside of the nozzle table 120 due to the centrifugal force of the nozzle table 120. Therefore, the chemical liquid and the cleaning solution hardly remain inside the nozzle table 120.

Since the upper side of the nozzle table 120 is blocked by the cover member 210, even when a small amount of fumes is generated inside the nozzle table 120, the fumes are blocked by the cover member 210 to not move upward. Thus, since the fumes generated from the nozzle table 120 are discharged to the outside of the nozzle table 120 due to the centrifugal force of the nozzle table 120, it is possible to prevent the fumes from reaching the substrate W.

Figure 8:
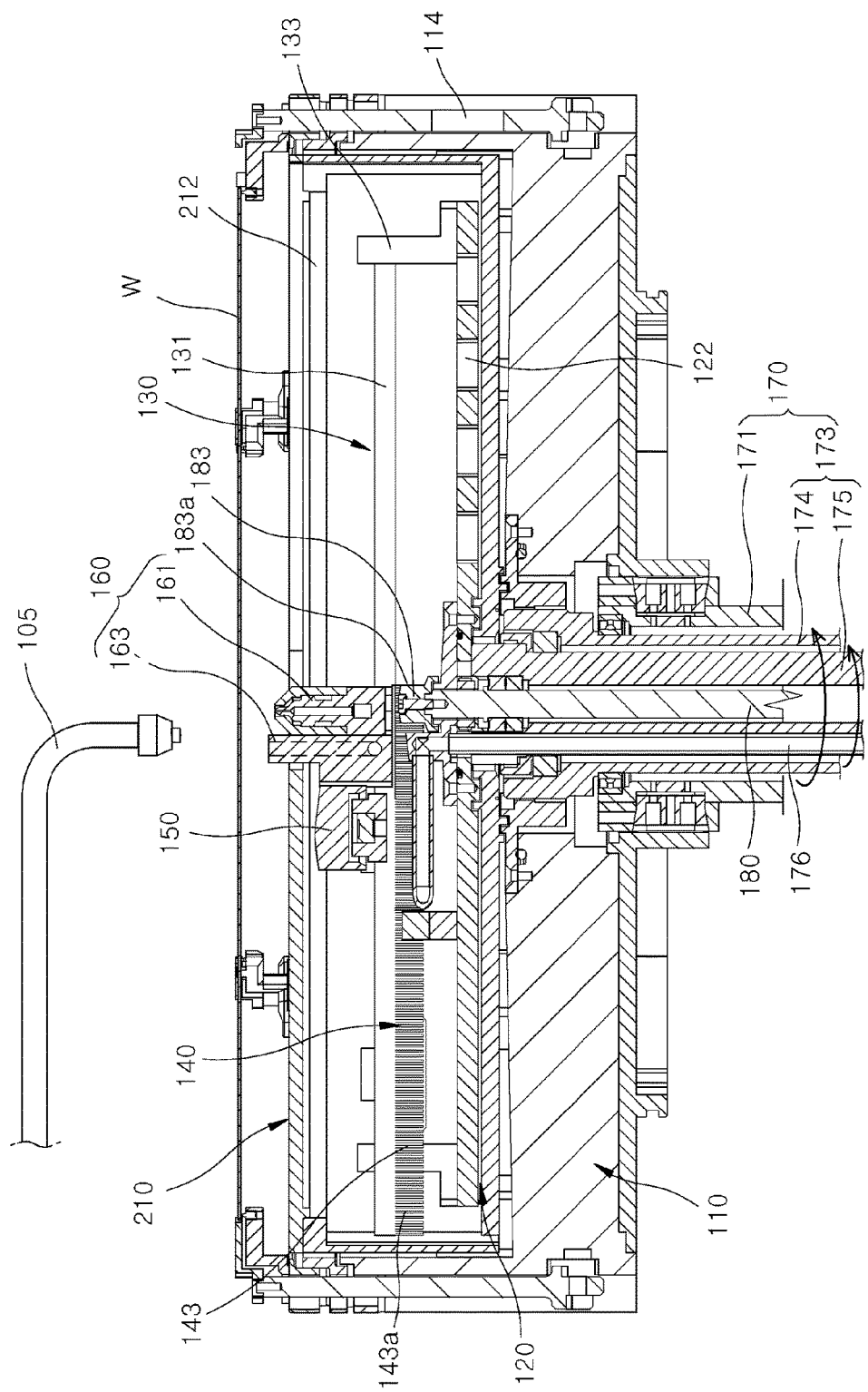
FIG. 8 is a cross-sectional view illustrating the operation state of the wafer processing apparatus during the cleaning process according to the embodiment of the present invention.

FIG. 8 is a cross-sectional view illustrating the operation state of the wafer processing apparatus during the cleaning process according to the embodiment of the present invention.

Referring to FIG. 8, when a drying process starts, the first driver 191 is controlled to rotate the first driving shaft 171, the second driver 193 is controlled to rotate the second outer shaft 174, and the third driver 195 is controlled to stop the moving shaft 180. In this case, the upper nozzle 105 and the second lower nozzle 163 spray a drying gas onto the both side surfaces of the substrate W according to a type of the substrate W, and as the rotating chuck 110 is rotated, the substrate W is rotated. In addition, the rotating chuck 110 and the nozzle table 120 are simultaneously rotated, and the moving shaft 180 is maintained in a stationary state. Since the second lower nozzle 163 of the lower nozzle part 160 sprays the drying gas onto the lower surface of the substrate W, the drying gas flows toward the peripheries of the both side surfaces of the substrate W due to the centrifugal force of the substrate W to dry the substrate W. An inert gas such as nitrogen gas may be applied as the drying gas.

During the drying process, the drying gas may not be sprayed from the upper nozzle 105 and the second lower nozzle 163. In this case, since the cleaning solution remaining on the substrate W flows to the periphery of the substrate W due to the centrifugal force of the substrate W, the substrate W is dried.

As described above, in the chemical liquid process, since a small amount of the chemical liquid on the lower surface of the substrate W falls on the cover member 210, and the cover member 210 and the nozzle table 120 are maintained in a stationary state, only a very small portion of the small amount of the chemical liquid falling on the cover member 210 is introduced into the nozzle table 120 through the movement passage 212 of the cover member 210. Therefore, it is possible to prevent the moving module 140, the fluid supply line part 165, the lower nozzle part 160, and the guide arm 150, which are installed in the nozzle table 120, from being contaminated due to the chemical liquid.

Since an amount of the chemical liquid introduced into the nozzle table 120 is significantly reduced in the chemical liquid process, an amount of fumes generated from the nozzle table 120 in the cleaning process may be significantly reduced. In addition, since the cover member 210 blocks the upper side of the nozzle table 120, a small amount of fumes generated from the nozzle table 120 also may not reach the lower surface of the substrate W. In addition, in the cleaning process, since the nozzle table 120 and the cover member 210 are rotated, the fumes generated inside the nozzle table 120 are discharged to the outside of the nozzle table 120 due to the centrifugal force of the nozzle table 120. Therefore, even when the fumes are generated in the cleaning process, since the fumes hardly affect the lower surface of the substrate W, it is possible to significantly reduce a cleaning dispersion and a defective rate of the substrate W.

In accordance with the present invention, since an upper nozzle part and a lower nozzle part spray a fluid on both side surfaces of a wafer, the both side surfaces of the wafer can be processed simultaneously.

In addition, in accordance with the present invention, since a guide arm supports a fluid supply line part, it is possible to prevent the fluid supply line part from being damaged due to centrifugal forces of a rotating chuck and a nozzle table.

In addition, in accordance with the present invention, since a cover member covers an upper side of the nozzle table, a chemical liquid and a cleaning solution sprayed onto the wafer can be blocked by the cover member so that the chemical liquid and a cleaning solution are hardly introduced into the nozzle table.

In addition, in accordance with the present invention, since the rotating chuck is rotated and the nozzle table and the cover member are maintained in a stationary state during a chemical liquid process, a small amount of the chemical liquid falling on the cover member also hardly flows from the cover member. Therefore, it is possible to prevent the chemical liquid from being introduced into the nozzle table through a movement passage.

In addition, in accordance with the present invention, since the chemical liquid is prevented from being introduced into the nozzle table in the chemical liquid process, it is possible to prevent fumes from being generated during a cleaning process or prevent the chemical liquid which remains during a drying process from rebounding. In addition, it is possible to significantly reduce a cleaning dispersion and a defect rate of the wafer.

While the present invention has been described with reference to the embodiments shown in the drawings, these embodiments are merely illustrative and it should be understood that various modifications and equivalent other embodiments can be derived by those skilled in the art on the basis of the embodiments.

Therefore, the true technical scope of the present invention should be defined by the appended claims.

What is claimed is:

1. A wafer processing apparatus comprising:
   a rotating chuck which is rotatably installed inside a cup housing and on which a substrate is mounted;
   a nozzle table rotatably installed inside the rotating chuck;
   a guide installed inside the nozzle table;
   a moving module movably installed on the guide;
   a guide arm connected to the moving module and configured to support a fluid supply line part;
   a lower nozzle part coupled to the guide arm to move together with the moving module and connected to the fluid supply line part;
   a driving shaft part connected to the rotating chuck and the nozzle table to rotate the rotating chuck and the nozzle table;
   a moving shaft rotatably installed inside the driving shaft part and connected to the moving module to move the moving module; and
   a driver connected to the driving shaft part and the moving shaft to drive the driving shaft part and the moving shaft.

2. The wafer processing apparatus of claim 1, wherein the guide includes a guide rail disposed to cross the inside of the nozzle table.

3. The wafer processing apparatus of claim 2, wherein the moving module includes:
   a slider movably coupled to the guide rail; and
   a rack bar connected to the slider, connected to the guide arm, and installed to be engaged with the moving shaft.

4. The wafer processing apparatus of claim 3, wherein the moving shaft includes:
   a moving shaft body rotatably installed in a central portion of the driving shaft part and connected to the driver; and
   a pinion connected to the moving shaft body to be engaged with the rack bar.

5. The wafer processing apparatus of claim 3, wherein the lower nozzle part includes:
   a first lower nozzle installed on the guide arm to be moved together with the rack bar and connected to the fluid supply line part; and
   a second lower nozzle installed on the guide arm to be moved together with the rack bar and connected to the fluid supply line part.

6. The wafer processing apparatus of claim 1, wherein the driving shaft part includes:
   a first driving shaft connected to the rotating chuck and the driver; and
   a second driving shaft rotatably installed between the first driving shaft and the moving shaft and connected to the nozzle table and the driver.

7. The wafer processing apparatus of claim 6, wherein the second driving shaft includes:
   a second outer shaft disposed inside the first driving shaft to be concentric therewith; and
   a second inner shaft which is disposed inside the second outer shaft to be concentric therewith and in which a fluid flow line part connected to the fluid supply line part is formed.

8. The wafer processing apparatus of claim 7, wherein the driver includes:
   a first driver connected to the first driving shaft and configured to rotate the first driving shaft;
   a second driver connected to the second outer shaft and configured to rotate the second outer shaft; and
   a third driver connected to the moving shaft and configured to rotate the moving shaft.

9. The wafer processing apparatus of claim 8, wherein, during a chemical liquid process, the first driver is controlled to rotate the first driving shaft, the second driver is controlled to stop the second outer shaft, and the third driver is controlled to rotate the moving shaft.

10. The wafer processing apparatus of claim 8, wherein, during a cleaning process, the first driver is controlled to rotate the first driving shaft, the second driver is controlled to rotate the second outer shaft, and the third driver is controlled to stop the moving shaft.

11. The wafer processing apparatus of claim 8, wherein, during a drying process, the first driver is controlled to rotate the first driving shaft, the second driver is controlled to rotate the second outer shaft, and the third driver is controlled to stop the moving shaft.

12. The wafer processing apparatus of claim 1, further comprising a cover member which is installed to cover an upper side of the nozzle table and in which a movement passage is formed to allow the lower nozzle part to be moved.

13. The wafer processing apparatus of claim 12, wherein the cover member is formed in a form of a circular plate to cover the upper side of the nozzle table.

14. The wafer processing apparatus of claim 12, wherein the movement passage is formed along the guide to allow the lower nozzle part to move.

* * * * *